(12) United States Patent
Eppes

(10) Patent No.: US 7,091,621 B1
(45) Date of Patent: Aug. 15, 2006

(54) CRACK RESISTANT SCRIBE LINE MONITOR STRUCTURE AND METHOD FOR MAKING THE SAME

(75) Inventor: David H. Eppes, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/768,179

(22) Filed: Feb. 2, 2004

(51) Int. Cl.
*H01L 23/48* (2006.01)
*H01L 23/52* (2006.01)
*H01L 29/40* (2006.01)

(52) U.S. Cl. .............. 257/782; 257/777; 257/E27.137; 257/E27.144

(58) Field of Classification Search ................ 257/782, 257/678, 701, 777, 778
See application file for complete search history.

(56) References Cited

U.S. PATENT DOCUMENTS

| | | | | |
|---|---|---|---|---|
| 5,538,924 A | * | 7/1996 | Chen | 438/132 |
| 6,180,261 B1 | * | 1/2001 | Inoue et al. | 428/626 |
| 6,197,618 B1 | * | 3/2001 | Guillot et al. | 438/118 |
| 6,326,296 B1 | * | 12/2001 | Tsai et al. | 438/624 |
| 6,451,681 B1 | * | 9/2002 | Greer | 438/601 |
| 6,653,710 B1 | * | 11/2003 | Adkisson et al. | 257/529 |

* cited by examiner

*Primary Examiner*—David Nhu

(57) ABSTRACT

A method and structure prevents crack propagation to the active die circuitry of a main die area during sawing around the outer periphery of the main die area. Stress relief elements, such as dummy vias, are provided in the scribe line area between the saw lane and the main die area. The dummy vias prevent cracks induced by the sawing process from propagating to the main die area.

10 Claims, 2 Drawing Sheets

CRACK RESISTANT SCRIBE LINE MONITOR STRUCTURE AND METHOD FOR MAKING THE SAME

FIELD OF THE INVENTION

The present invention relates to the field of semiconductor device fabrication, and more particularly, to the separation of semiconductor devices from a semiconductor wafer.

BACKGROUND OF THE INVENTION

In efforts to improve the operating performance of a chip, low k dielectric materials have been increasingly investigated for use as replacements for dielectric materials with higher k values. Lowering the overall k value of the dielectric layer employed in the metal interconnect layers lowers the RC of the chip and improves its performance. There are a number of concerns in using low k materials, such as being more difficult to handle than traditionally employed higher k materials, such as oxides. Also, low k dielectric materials are readily damaged by techniques used to remove photoresist materials after the patterning of a layer. Another problem with low k dielectric materials, especially porous low k dielectric materials, is their relatively low mechanical strength. This can lead to a number of concerns in the final product, since a relatively low mechanical strength makes the low k materials susceptible to delamination and scratching during chemical mechanical polishing.

In the manufacturing process, a semiconductor wafer contains a large number of main die areas that are separated from each other by a sawing process. Typically, a scribe line monitor (SLM) area circumferentially surrounds each main die area that contains the functional circuitry of the semiconductor chip. The scribe line monitor area normally includes a test pattern or photo keys for monitoring process steps and aligning the wafer. The sawing takes place through the scribe line monitor area so as not to damage the functional circuitry contained within the main die area. The remaining scribe line monitor area that circumferentially surrounds the main die area after the sawing has taken place provides a safety margin to protect the functional circuitry in the main die area.

The use of low k dielectric films in recent generations of semiconductor technology exhibit poor fracture toughness and layer to layer adhesion. It is believed by the inventor that these properties of low k dielectric films lead to an increased incidence of cracking delamination during the sawing process. The sawing process causes cracks to occur at the saw line that tend to propagate into the main die area. When such cracks propagate into the main die area, the functional circuitry may be compromised and rendered useless. This leads to a loss of yield and decreased productivity.

SUMMARY OF THE INVENTION

There is a need for providing a structure and methodology for making the same that prevents or reduces cracks from propagating to a main die area during the sawing or post-saw handling processes.

This and other needs are met by embodiments of the present invention which provide a method of forming a semiconductor device comprising the steps of forming dummy vias in a semiconductor wafer between a main die area and a saw lane of the semiconductor wafer. The semiconductor wafer is then sawn along the saw lane to separate the main die area from the semiconductor wafer.

It is believed that the dummy vias in the embodiments of the present invention provide a stress relief and preferential fracture planes to make the area between the main die area and the saw lane more crack resistant during sawing or handling after the sawing process.

The earlier stated needs are also met by other embodiments of the present invention which provide a semiconductor device comprising a main die area containing functional circuitry, a scribe line monitor area circumferentially surrounding the main die area, and stress relief elements in the scribe line monitor area.

It is believed that the use of stress relief elements in the scribe line monitor area serve to prevent propagation of cracks during sawing into the main die area. In certain embodiments of the invention, the stress relief elements are metal vias provided in the dielectric layer between metal layers.

The earlier stated needs are also met by other aspects of the present invention which provide a semiconductor arrangement comprising a main die area, a surrounding area circumferentially surrounding the main die area, and crack stop elements in the surrounding area.

By locating crack stop elements in the area surrounding a main die area, cracks are prevented from propagating from the surrounding area into the main die area, thereby improving yield and increasing the quality of the functional circuitry of the main die area. In certain embodiments of the invention, the crack stop elements include dummy vias.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to the propagation of cracks during sawing or die mishandling after a saw process has been performed. These cracks can propagate to the main die area, and are especially prevalent in devices employing low k dielectric layers, possibly due to low k dielectric adhesion to metals.

These problems are solved, in part, by the present invention which provides for stress relief elements or crack stop elements, provided in a scribe line monitor area that circumferentially surrounds the main die area. These stress relief elements or crack stop elements, in the form of dummy vias, for example, serve to make the scribe line monitor area crack resistant so that cracks do not propagate, during sawing or post-saw handling, to the main die area. This increases the yield and reliability of the final product.

Figure 1:
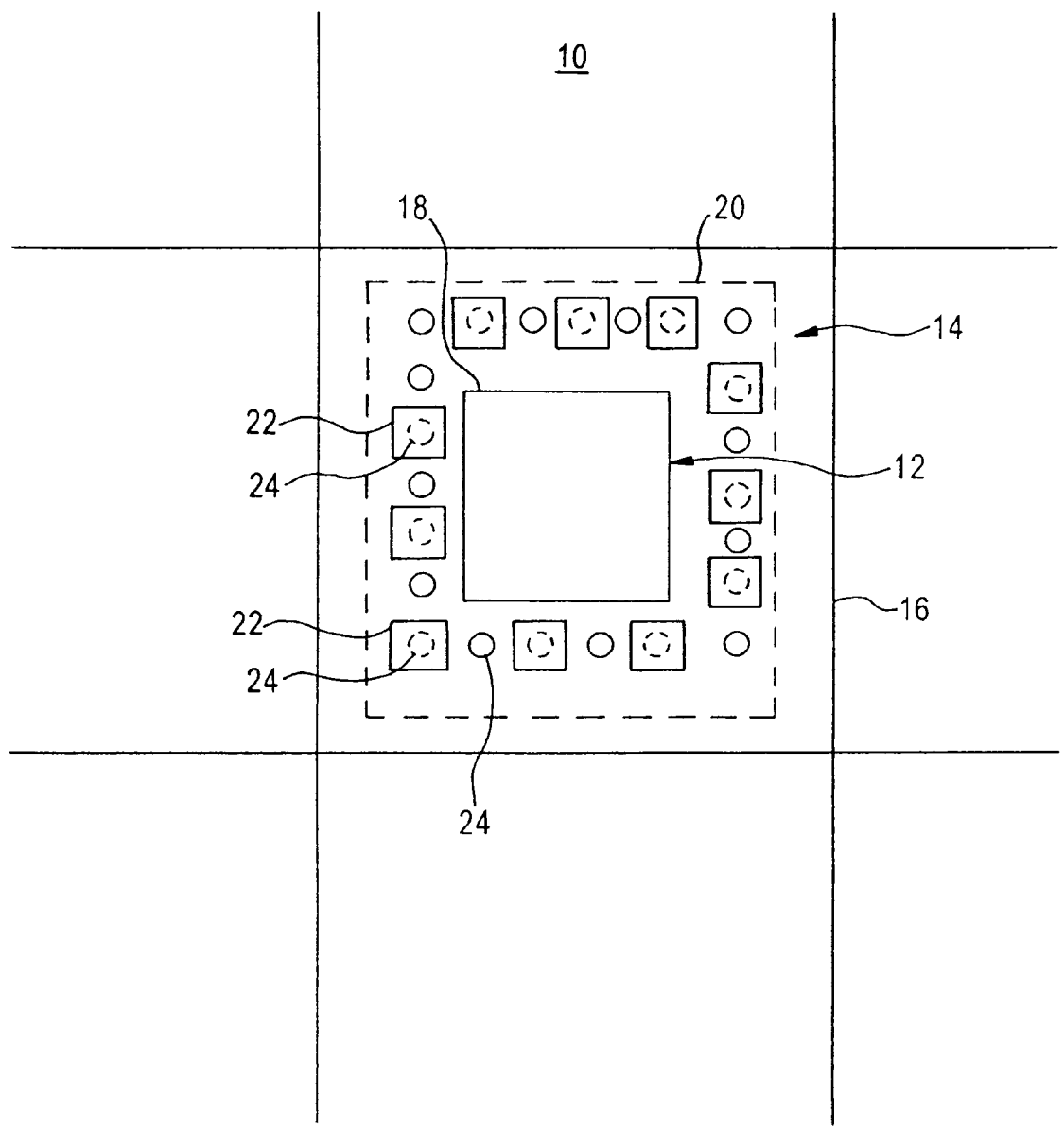
FIG. 1 is a top schematic view of a portion of a semiconductor wafer constructed in accordance with embodiments of the present invention.

FIG. 1 depicts a top view of a portion of a semiconductor wafer 10 which is formed in accordance with embodiments of the present invention. As is well-known, a semiconductor wafer 10 is produced with a large number of main die areas 12 that each contain the functional circuitry for a semiconductor chip that forms the final product. Each main die area 12 is surrounded circumferentially by a scribe line monitor area 14. The boundaries of the scribe line monitor area 14 is further defined by the periphery 18 of the main die area 12 and the peripheries 18 of the adjacent die areas 12. Thus, the scribe line monitor area 14 is defined as the area between the peripheries of the main die areas 18. Conventional scribe line monitor elements, such as photo keys and test patterns, are not depicted in FIG. 1 so as not to obscure the present invention.

Die saw occurs along line 16 which resides in the scribe line monitor area 14. The center line of the saw blade will be coincident with line 16. During the saw process, wafer material is removed. This removal of material separates the chip from the rest of the semiconductor wafer 10. As a consequence, the edges of the sawn chip will be defined by periphery 20. A safety margin of material surrounding the main die area 12 is provided by the separation of the chip edge 20 from the periphery 18 of the main die area 12. However, as described earlier, cracks induced by the sawing process can propagate to the main die area 12 during sawing, or even during handling of the die after the sawing process. Further, delamination may also occur. These problems are especially prevalent when low k dielectric materials are employed as dielectric layers.

Typically, scribe line monitor areas 14 include a plurality of metal tiles, which are known as polish tiles, normally utilized during chemical-mechanical polish (CMP) processes. The use of tiles in CMP is well-known. These tiles, provided with reference numeral 22, are electrically non-functional. In other words, although formed in the metallization layers, the tiles 22 are not electrically connected to functional circuitry.

In order to make the scribe line monitor area 14 more crack resistant to prevent saw induced cracks from propagating into the active die circuitry of the main die area 12, a plurality of stress relief elements (or crack stop elements) are provided in the scribe line monitor area 14. In embodiments of the invention, the stress relief elements are formed by dummy vias 24. As will be described later, some of these dummy vias 24 are connected between the tiles 22, while other dummy vias are not connected to any tiles 22. Dummy vias 24 are indicated in FIG. 1, with those dummy vias 24 connected to a metal tile 22 being indicated by dashed lines.

The number of dummy vias in the scribe line monitor area 14 may be varied in accordance with different embodiments of the present invention. However, the inventors have determined that increasing the number of dummy vias serves to increase the crack resistance in the scribe line monitor area 14, so that a larger number of dummy vias 24 is preferable.

Figure 2:
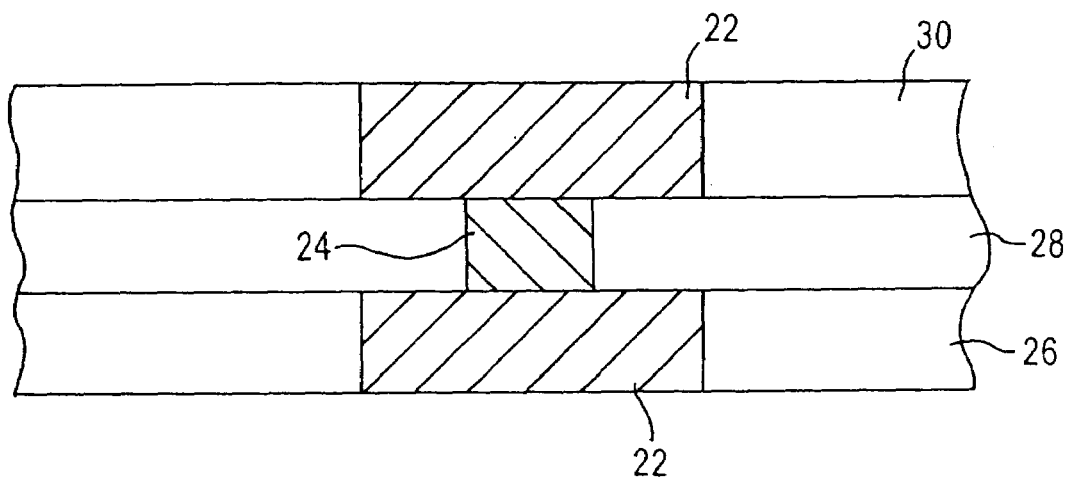
FIG. 2 is a schematic cross-section side view of a via connected between tiles in a scribe line monitor area in accordance with embodiments of the present invention.

The dummy vias are made of metal, such as copper, for example. The dummy vias 24 are termed "dummy" since they are not electrically connected to functioning circuitry. Preferably the dummy vias 24 are connected between the tiles 22 located in metal layers above and below the dielectric layer in which the dummy via 24 is located. For example, as seen in FIG. 2, a metal tile 22 is provided in a first metal layer 26. A dielectric layer 28 is formed on the first metal layer 26. The dummy via 24 is formed within the dielectric layer 28. The dummy via 24 is connected to a second tile 22 provided in a second metal layer 30 formed on the dielectric layer 28. As stated earlier, these metal tiles 22 are non-functional.

Figure 3:
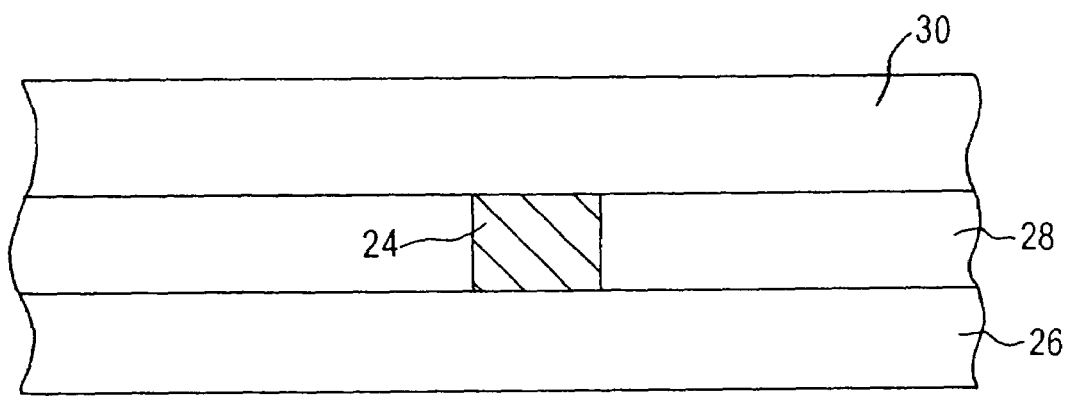
FIG. 3 shows a via provided between metal layers but unconnected to tiles in a scribe line monitor area in accordance with embodiments of the present invention.

By contrast, FIG. 3 shows a dummy via 24 provided between first and second metal layers 26, 30, but not connected between metal tiles 22. These dummy vias 24 provide additional crack resistance, but do not appear to, be as effective in providing crack resistance as dummy vias 24 that are connected between metal tiles 22.

The dielectric layer 28 may be any dielectric material, but in certain embodiments of the invention, is a low k dielectric material as is commonly understood by those of ordinary skill in the art. For example, the dielectric layer 28 may be a low k dielectric material having a dielectric constant of less than about 3.9. It has been found that the use of such low k dielectric materials, although providing many advantages in the device, are more subject to propagation of saw induced cracks to the active circuitry in a main die area 12. Hence, the stress relief provided by the dummy vias 24 in the present invention overcomes the problems created by the use of low k dielectric material in the formation of semiconductor devices.

The dummy vias 24 may be laid out manually within the scribe line monitor area 12, or may be laid out by automated placing of the dummy vias 24 within the scribe line monitor area 12.

The present invention thus provides a structure and method for making the same that prevents the propagation of cracks to the active die circuitry of a main die area, these cracks being caused by sawing or handling after the sawing process. This is achieved in a readily manufacturable methodology, by adding stress relief (crack stop) elements, such as dummy vias in the area between the saw lane and the outer periphery of the main die area.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A semiconductor device comprising: a main die area containing functional circuitry; a scribe line monitor area circumferentially surrounding the main die area; and stress relief elements in the scribe line monitor area, wherein the stress relief elements include dummy vias in the scribe line monitor area.

2. The semiconductor device of claim 1, wherein the scribe line monitor area includes at least a first metal layer, a dielectric layer on the first metal layer, and a second metal layer on the first dielectric layer.

3. The semiconductor device of claim 2, wherein the dielectric layer is a low k dielectric layer.

4. The semiconductor device of claim 3, wherein the first and second metal layers contain non-functional metal tiles.

5. The semiconductor device of claim 4, wherein at least one of the dummy vias is connected between one of the metal tiles in the first metal layer and one of the metal tiles in the second metal layer.

6. The semiconductor device of claim 5, wherein the scribe line monitor area includes a saw lane, the dummy vias being located between the saw lane and the main die area.

7. A semiconductor arrangement comprising:
a main die area;
a surrounding area circumferentially surrounding the main die area; and
crack stop elements in the surrounding area, wherein the crack stop elements include dummy vias.

8. The semiconductor arrangement of claim 7, wherein the surrounding area is a scribe line monitor area.

9. A semiconductor arrangement comprising:
a main die area;

a surrounding area circumferentially surrounding the main die area; and crack stop elements in the surrounding area, wherein the crack stop elements include dummy vias and the surrounding area is a scribe line monitor area that includes a first metal layer, a dielectric area on the dielectric layer, and a second metal layer on the dielectric layer, each of the first and second metal layers including non-functional metal tiles, and at least some of the dummy vias being connected between the metal tiles of the first and second metal layers.

10. The semiconductor arrangement of claim 9, wherein the dielectric layer comprises a low k dielectric material.

* * * * *